(12) United States Patent
Schnieder

(10) Patent No.: US 7,369,456 B2
(45) Date of Patent: May 6, 2008

(54) DRAM MEMORY WITH AUTOPRECHARGE

(75) Inventor: Ralf Schnieder, München (DE)

(73) Assignee: Qimonda AG, Munich (DE)

( * ) Notice: Subject to any disclaimer, the term of this patent is extended or adjusted under 35 U.S.C. 154(b) by 56 days.

(21) Appl. No.: 11/481,495

(22) Filed: Jul. 5, 2006

(65) Prior Publication Data
US 2007/0008808 A1    Jan. 11, 2007

(30) Foreign Application Priority Data
Jul. 6, 2005    (DE) ...................... 10 2005 031 643

(51) Int. Cl.
*G11C 7/22*    (2006.01)
*G11C 8/18*    (2006.01)
*G11C 11/4076*    (2006.01)

(52) U.S. Cl. ...................... 365/233; 365/193; 365/194; 365/203

(58) Field of Classification Search ................ 365/193, 365/194, 203, 233, 233.03
See application file for complete search history.

(56) References Cited

U.S. PATENT DOCUMENTS

| | | | |
|---|---|---|---|
| 5,748,560 A * | 5/1998 | Sawada | 365/233 |
| 6,343,040 B2 * | 1/2002 | Bae | 365/203 |
| 6,507,526 B2 * | 1/2003 | Ohtake | 365/203 |
| 2002/0001244 A1 | 1/2002 | Ohtake | |
| 2002/0013881 A1 | 1/2002 | Delp et al. | |
| 2003/0185075 A1 * | 10/2003 | Park et al. | 365/203 |
| 2004/0120210 A1 * | 6/2004 | Lee | 365/232 |

* cited by examiner

*Primary Examiner*—J. H. Hur
(74) *Attorney, Agent, or Firm*—Jenkins, Wilson, Taylor & Hunt, P.A.

(57) ABSTRACT

A DRAM memory comprises a memory cell bank comprised of memory cells being activated by means of internal row and column access instructions, a command decoder generating, dependent on an external memory access instruction, at least one column access instruction within a first and at least one row access instruction within a second decoding time, and a clock signal delay circuit for delaying an external clock signal with the first decoding time for generating an internal column clock signal and for delaying the external clock signal with the second decoding time for generating an internal row clock signal. Each memory cell bank comprises an associated APC counter for delaying a column access instruction with autoprecharge. Each of the column access instructions are respectively delayed by an associated shift register being clocked by the internal column clock signal for generating the internal column access instructions. The APC counter is clocked by the internal row clock signal and delays each of the column access instructions in accordance with an associated programmable count for producing an internal autoprecharge instruction for the associated memory cell bank.

13 Claims, 7 Drawing Sheets

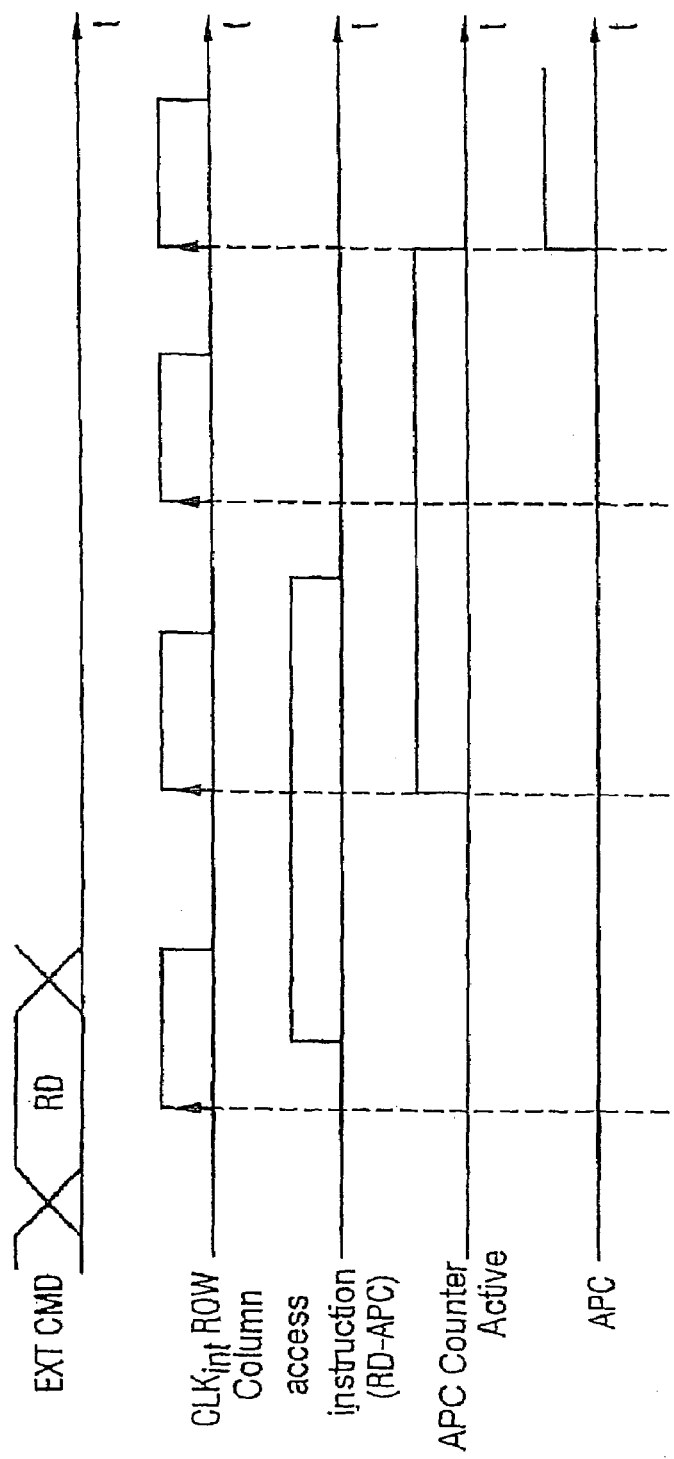

DRAM MEMORY WITH AUTOPRECHARGE

BACKGROUND OF THE INVENTION

The invention relates to a DRAM memory.

DRAM semiconductor memories are integrated circuits for storing binary data. In random access semiconductor memories, the memory cells are arranged in matrix form in a memory cell bank. A semiconductor memory chip can contain a plurality of memory cell banks. A RAM (Random Access Memory) is a main memory which allows rapid storage (writing) and reading of data, writing and reading being separate operations. During reading, the stored data information is not erased. During writing, the previously stored information is overwritten. DRAM stores are volatile memories which lose their information when the operating voltage is switched off, which means that storage requires the presence of the supply voltage and a periodic data refresh operation. A memory cell bank comprises a multiplicity of memory cells arranged in matrix form. These memory cells are activated by means of internal row and column access instructions. This memory cell usually comprises integrated MOS capacitances for storing a charge. A selection transistor can be used to connect the capacitance to a bit data line which is connected to an extremely sensitive amplifier (sense amplifier). The gate of the selection transistor is actuated by the selection line.

To access a memory cell, the row or selection line is first of all selected or activated and then the data lines arranged in column form are selected using a column access operation. An external row precharge instruction or autoprecharge (APC) is used to put the memory cell into a state before it is activated. To this end, the selection line or row of the memory cell is decoupled by the sense amplifier. When a read instruction (Read) or a write instruction (Write) is received, an automatic precharge or autoprecharge is normally initiated within the DRAM chip.

To execute an automatic precharge at a predetermined adjustable interval of clock cycles after a read or write access operation to a DRAM store, an autoprecharge counter or APC counter is provided within the DRAM store, said counter counting an adjustable number of clock cycles and, when this number of clock cycles has been reached, outputting an autoprecharge instruction APC which initiates the precharge within the memory cell bank. Autoprecharge counters are programmable for a flexible counting range.

FIG. 1 shows a block diagram of a conventional DRAM store. The DRAM store comprises at least one memory cell bank with a multiplicity of memory cells which can be activated by means of internal row and column access instructions. For each memory cell bank within the DRAM chip, there is an associated APC counter for delaying a column access instruction with autoprecharge (APC).

The DRAM chip receives an external memory access instruction via an external instruction bus, said instruction being decoded by a command decoder provided in the DRAM chip. The command decoder produces row access instructions and column access instructions. The row access instructions comprise, in particular, an activation row access instruction (ROW-act) and a precharge row access instruction (ROW-pre). Column access instructions comprise, in particular, a write column access instruction (WR) with autoprecharge (APC) and a read column access instruction (RD) with autoprecharge (APC). In addition, there is a read column access operation (RD) and a write column access operation (WR) without autoprecharge (APC), the precharge operation being performed automatically; for the purpose of generating the column access instructions and the row access instructions the command decoder requires different decoding times. In this context, the decoding time for generating column access instructions (WR-APC, RD-APC) is shorter than the decoding times $T_{DEC2}$ for generating row access instructions such as ROW-act, ROW-pre. The column access instructions WR-APC and RD-APC produced by the command decoder are respectively delayed by an associated shift register SR. These shift registers SR are programmable for the purpose of setting latencies. The shift registers SR output the internal column access instructions (WR-APC$_{int}$, RD-APC$_{int}$ and WR, RD without APC) delayed in accordance with the programmed latency, and these instructions are supplied to the autoprecharge counter. The shift registers SR are clocked by an internal clock signal CLK$_{int}$ in the DRAM chip. The internal clock signal CLK$_{int}$ is produced from an external clock signal CLK$_{ext}$ by delaying the external clock signal using a delay circuit with a particular time delay $\Delta T$. The delay circuit is used to compensate for the different decoding times for the row access instructions and the write access instructions. The APC counter, which, in the case of the DRAM chip based on the prior art which is shown in FIG. 1, is likewise clocked by the internal clock signal CLK$_{int}$, delays the applied internal column access instruction in accordance with an associated start value which is read from a start value memory. When a set final value has been reached, the APC counter outputs an internal autoprecharge instruction APC. An OR gate receives the internal autoprecharge instruction and logic ORs it with the precharge row access instruction which is output by the command decoder in order to actuate an internal memory bank controller which resets a row selection control signal (ROW-SELECT) for selecting a memory cell row to the memory cell bank, i.e. ROW-SELECT is set with ACT and is reset with PRE.

FIGS. 2a, 2b illustrate access to a memory cell within the memory cell bank based on the prior art. In this case, the DRAM store sends a read instruction via the external instruction bus. First of all, as FIG. 2a shows, a row is activated within the memory cell matrix by virtue of the internal memory bank controller, having received an activation row access instruction (ROW-act) from the command decoder, generating a row selection control signal (ROW-sel) following receipt of a rising signal edge of the internal clock signal, the result being a signal delay in $\Delta t_{ROW}$. This signal delay $\Delta t_{ROW}$ is relatively uncritical, since the actual access to the memory cell does not take place until after a subsequent column access operation, as shown in FIG. 2b. When the memory cell row has been selected, as shown in FIG. 2a, the actual data access follows in a column access operation after the shift register SR has output an internal read instruction (RD$_{int}$). The delay time between the rising edge of the internal clock signal and the application of the internal read instruction should be as short as possible in this case.

The conventional DRAM store shown in FIG. 1 has the drawback that the delay time $\Delta T$ for delaying the external clock signal CLK is determined by the longest decoding time in a command decoder. In order to decode the row access instructions ROW-act and ROW-pre, the command decoder requires a much longer decoding time than for decoding the column access instructions WR-APC, RD-APC. The time delay $\Delta T$ for generating the internal clock signal CLK$_{int}$ is therefore set in accordance with the longest decoding time, i.e. in accordance with the decoding time for decoding a row access instruction, in the case of the conventional DRAM store shown in FIG. 1. Since the DRAM chip based on the prior art, as is shown in FIG. 1, has only one common internal clock signal or one clock signal domain which, in particular, also clocks the shift registers SR for the column access instructions, the result of the delay in the clock signal CLK in accordance with the longest necessary decoding time $D_{DECmax}$ within the command decoder is that the column access time and hence the memory access time increase.

Although simply splitting the clock domains into two clock domains for pure row access instructions and column access instructions, as is shown in FIG. 3, results in a reduction in the column access time, this may lead to the internal autoprecharge instruction (APC) being generated one clock cycle too late. In the case of the DRAM chip shown in FIG. 3, the chip contains a clock signal delay circuit having two different delay lines, with an internal column clock signal $CLK_{COLUMN}$ and an internal row clock signal $CLK_{ROW}$ being generated. The DRAM chip shown in FIG. 3 is not a DRAM chip based on the prior art, but rather is used merely to illustrate the problem on which the invention is based. The first delay $\Delta T_1$ is used to produce the internal column clock signal and is shorter than the second delay $\Delta T_2$ for generating the internal row clock signal. The first delay $\Delta T_1$ is set in accordance with the first decoding time $T_{DEC1}$ in the command decoder for the purpose of producing the column access instruction. The second delay time $\Delta T$ for generating the internal row clock signal is set in accordance with the second decoding time $T_{DEC2}$ in the command decoder for the purpose of generating a row access instruction. Although splitting the clock domains into two clock domains reduces the column access time, it results in a signal transition between two clock signal domains, namely at the location between the outputs of the shift register SR and the inputs of the autoprecharge counter. The internal column access instruction which is respectively output by the shift registers SR initiates the APC counter, but this is clocked by the column clock signal $CLK_{int-ROW}$, i.e. in the other clock signal domain. This can result in the APC counter counting one clock cycle too many, which means that the internal precharge instruction APC is output one clock cycle too late. In this case, the ROW precharge time $T_{RP}$, i.e. the period between precharge and activate, prescribed by the specification is infringed.

BRIEF SUMMARY OF THE INVENTION

A DRAM memory comprises:
at least one memory cell bank whose memory cells can be activated by means of internal row and column access instructions, each memory cell bank comprising an associated APC counter for delaying a column access instruction with autoprecharge;
a command decoder which takes an external memory access instruction as a basis for producing at least one column access instruction within a first decoding time and at least one row access instruction within a second decoding time; and
a clock signal delay circuit which delays an external clock signal with the first decoding time for the purpose of generating an internal column clock signal and with the second decoding time for the purpose of generating an internal row clock signal;
wherein the column access instructions produced by the command decoder are respectively delayed by an associated shift register, which is clocked by the internal column clock signal, for the purpose of producing the internal column access instructions; and wherein the APC counter is clocked by the internal row clock signal and delays the column access instructions produced by the command decoder respectively in accordance with a programmable count for the purpose of producing an internal autoprecharge instruction for the associated memory cell bank.

In the inventive DRAM store, the autoprecharge counter is clocked by the internal row clock signal and outputs an internal autoprecharge instruction APC when a programmable count has been reached. In this case, the autoprecharge counter or APC counter is connected to the column access instruction produced by the command decoder, or the counting operation is initiated when the column access instruction WR-APC, RD-APC is received. In contrast to the conventional DRAM chip, as is shown in FIG. 1, the inventive DRAM chip comprises two clock signal domains, i.e. two internal clock signals, namely the internal column clock signal $CLOCK_{intern-COLUMN}$ and the internal row clock signal $CLOCK_{intern-ROW}$, which are generated by a clock signal delay circuit. However, the APC counter in the case of the inventive DRAM store, in contrast to the conventional DRAM chip, is not initiated by the internal column access instructions which are output at the output of the shift register, but rather by the decoded column access instructions which are output by the command decoder. In the case of the inventive DRAM chip, there is therefore no signal transition between the two clock signal domains, which means that the APC counter never counts one clock cycle too many. Since the instructions which initiate the APC counter or start the counting operation no longer pass through the shift register, provided for setting the latency, in the case of the inventive DRAM chip, the count in the case of the counter provided within the inventive DRAM chip is set correspondingly higher in order to compensate for the passage time through the shift register.

In one particularly preferred embodiment of the inventive DRAM chip, the autoprecharge counter is formed by a linear feedback shift register.

Linear feedback shift registers have the advantage that the speed of the counting operation is independent of the counting range. In addition, the space requirement for a linear feedback shift register during integration on a chip is comparable to the space requirement for a conventional binary counter.

The linear feedback shift register may be programmable, or the shift registers provided may delay the column access instructions in accordance with an adjustable latency.

In one embodiment of the inventive DRAM chip, the command decoder produces a write column access instruction with autoprecharge, a read column access instruction with autoprecharge, an activation row access instruction and a precharge row access instruction.

The first decoding time for generating a column access instruction may be shorter than the second decoding time for generating a row access instruction.

The APC counter may receive a programmable counter start value which can be read from a start value memory using a multiplexer.

The start value memory may comprise an associated counter start value for each column access instruction. In this case, the start value memory may preferably be programmable.

The counter start values stored in the start value memory may be in binary-coded form.

In one preferred embodiment of the inventive DRAM chip, the APC counter has a conversion circuit which converts the binary-coded counter start value which has been read from the start value memory into an LFSR start value for the feedback shift register provided in the APC counter.

The APC counter may preferably comprise a control unit which, upon receiving the column access instruction, loads the LFSR start value into the LFSR shift register and starts the counting operation.

The APC counter may comprise a comparison unit which stops the counting operation and outputs the internal autoprecharge instruction when the LFSR shift register reaches an adjustable LFSR final value.

BRIEF DESCRIPTION OF THE SEVERAL VIEWS OF THE DRAWINGS

Preferred embodiments of the inventive DRAM memory are described below with reference to the appended figures in order to explain features which are fundamental to the invention.

FIG. 7 are flow diagrams to explain an autoprecharge operation in the case of the inventive DRAM memory.

DETAILED DESCRIPTION OF THE INVENTION

Figure 1:
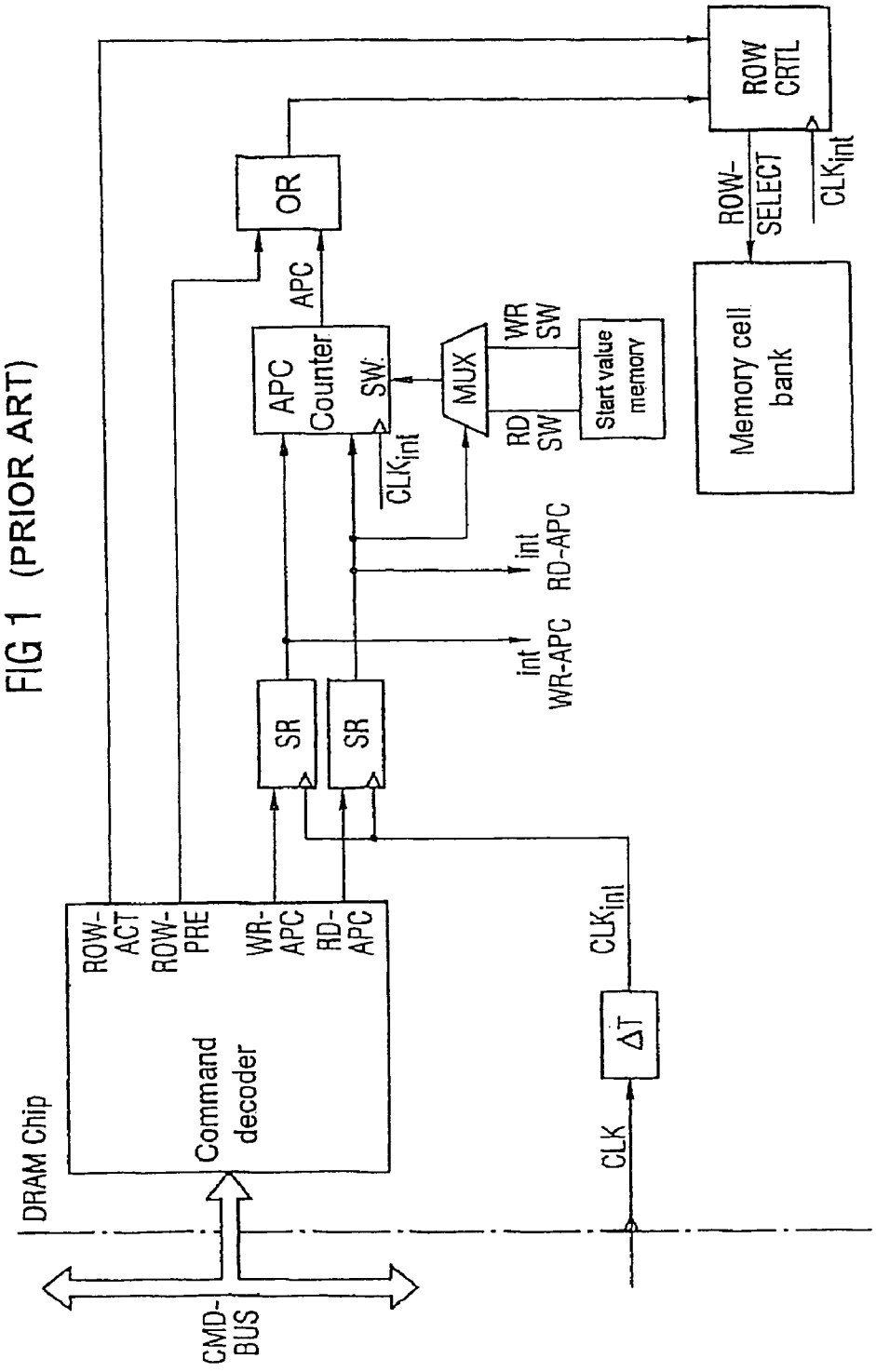
FIG. 1, as discussed above, is a conventional DRAM memory.
Figure 2A:
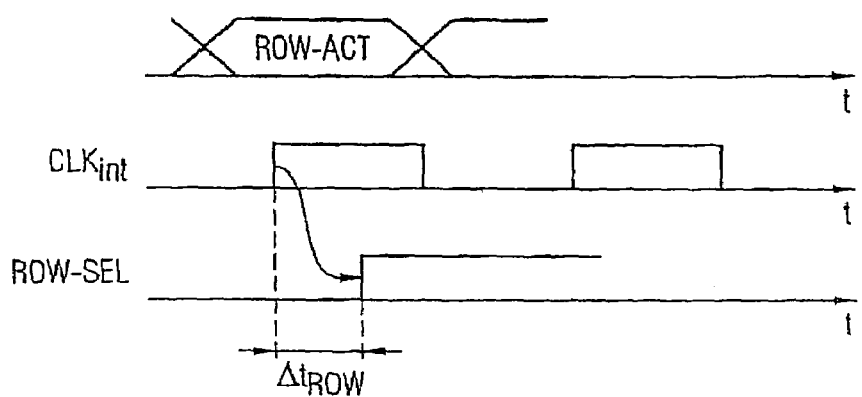
FIGS. 2a, 2b, as discussed above, are signal flow diagrams to explain a memory access operation in the case of a conventional DRAM memory chip.
Figure 2B:
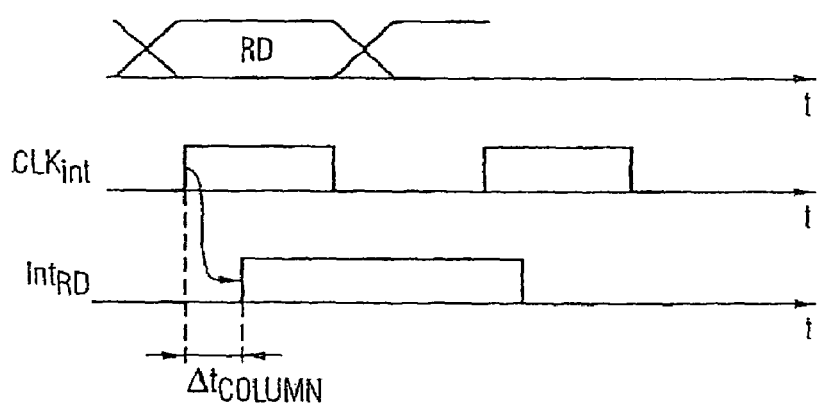
Figure 3:
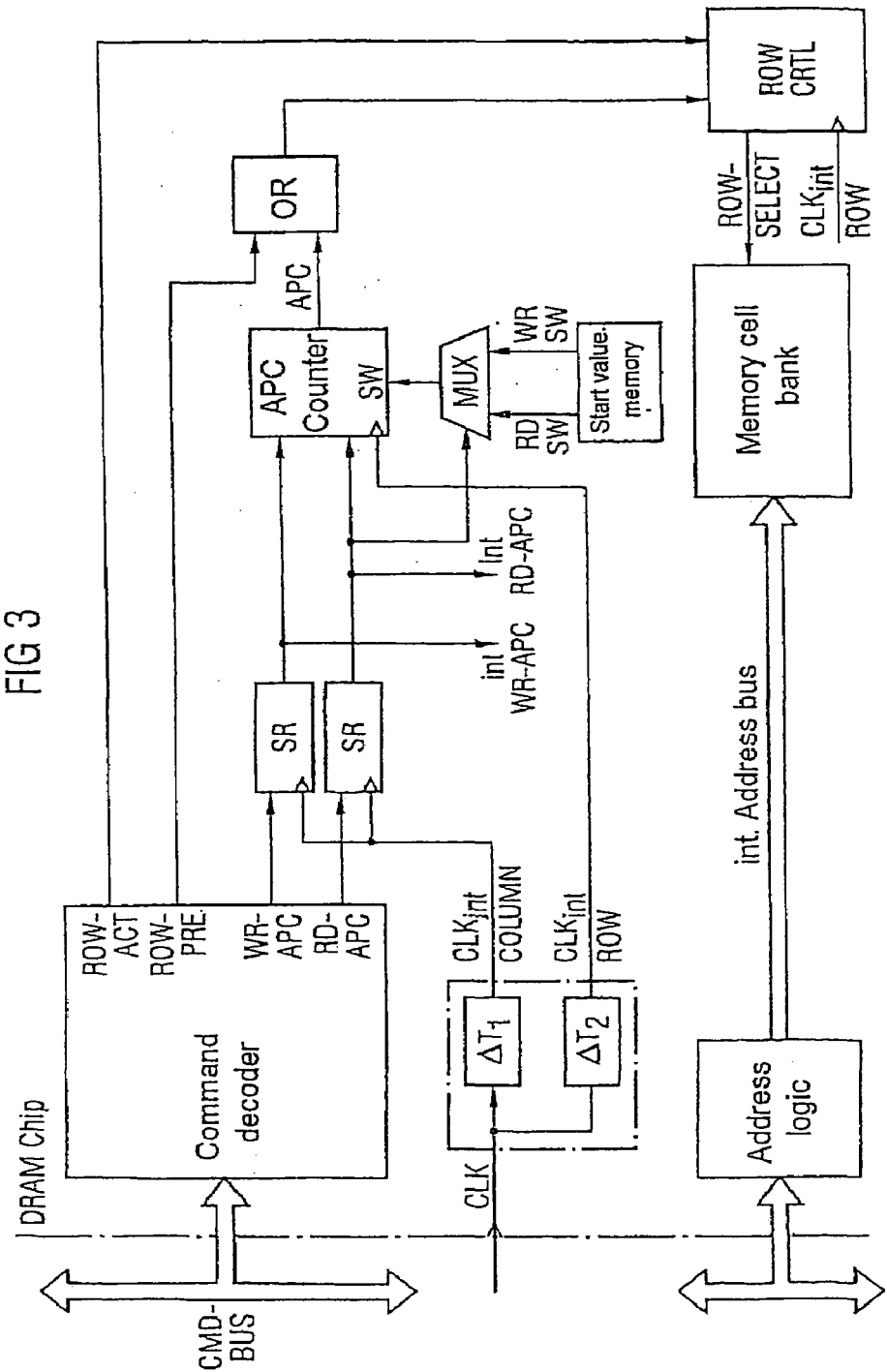
FIG. 3, as discussed above, is a block diagram to explain the problem on which the invention is based.
Figure 4:
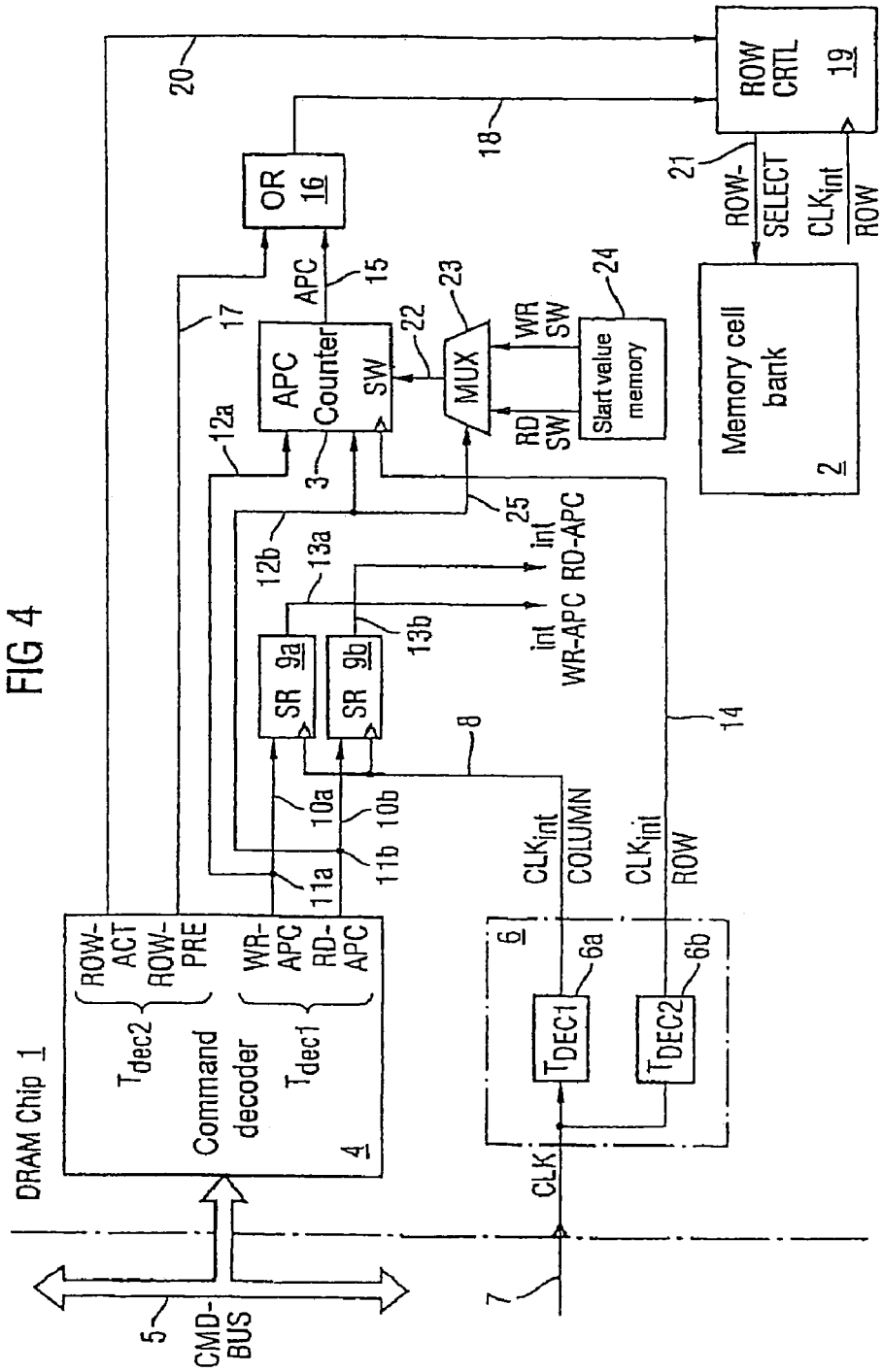
FIG. 4 is a block diagram for a preferred embodiment of the inventive DRAM store.

As can be seen from FIG. 4, the inventive DRAM store 1 has a memory cell bank 2 which has a multiplicity of memory cells. These memory cells in the memory cell bank 2 can be activated for the purpose of writing and reading data using internal row and column access instructions. In the embodiment shown in FIG. 4, just one memory cell bank 2 is shown. In an alternative embodiment, the inventive DRAM memory chip has a plurality of memory cell banks 2. For each memory cell bank 2, there is an associated autoprecharge counter or APC counter 3. This APC counter is used to delay a column access instruction with autoprecharge, for example a write instruction with autoprecharge (WR-APC) or a read instruction with autoprecharge (RD-APC).

The inventive DRAM store 1 contains a command decoder 4 whose input side is connected to an external instruction bus 5. The instruction bus 5 is used, for example by a microcontroller, to apply an external memory access instruction to the command decoder 4. The command decoder 4 encodes the applied external memory access instruction and produces a column access instruction within a first decoding time $T_{DEC1}$ and a row access instruction within a second decoding time $T_{DEC2}$. The column access instructions produced by the command decoder 4 comprise, inter alia, a write column access instruction with autoprecharge (WR-APC), a read column access instruction with autoprecharge (RD-APC), an activation row access instruction (ROW-act) and a precharge row access instruction (ROW-pre). The decoding times for the various access instructions to be produced via the command decoder 4 vary. The decoding times for producing column access instructions are shorter than the decoding times for producing row access instructions. All column access instructions are decoded within a first decoding time $T_{DEC1}$, while the row access instructions are decoded within a second decoding time $T_{DEC2}$, the second decoding time $T_{DEC2}$ being much longer than the first decoding time $T_{DEC1}$.

Since access to a memory cell within the memory cell bank 2 first of all involves a row access operation and then a column access operation, the total time for accessing the memory cell is determined essentially by the column access time.

The inventive DRAM store 1 contains a clock signal delay circuit 6 having a first signal delay unit 6a and a second signal delay unit 6b. An external clock signal line 7 is used by the clock signal delay circuit 6 in the inventive DRAM memory chip 1 to receive an external clock signal CLK. The first signal delay unit 6a delays this external clock signal CLK with the first decoding time $T_{DEC1}$, which is required for a column access instruction to be produced by the command decoder 4. The second signal delay unit 6b delays the external clock signal CLK with the second decoding time $T_{DEC2}$, which is required for a row access instruction to be produced by the command decoder 4. In this case, the first decoding time $T_{DEC1}$ is shorter than the second decoding time $T_{DEC2}$. The external clock signal delayed by the first delay unit 6a is applied to the shift registers 9a, 9b as internal column clock signal $CLK_{int-COLUMN}$ by the delay circuit 6 via an internal clock signal line 8. The two shift registers 9a, 9b are provided for the purpose of setting latencies. The two shift registers 9a, 9b each have a clock signal input which receives the internal column clock signal $CLK_{int-COLUMN}$ via the internal clock signal line 8. For each column access instruction, particularly for the write column access instruction with autoprecharge WR-APC and the read column access instruction with autoprecharge RD-APC, there is a respective associated shift register 9. The shift register 9a receives the write column access instruction with autoprecharge on the input side via a line 10a from the command decoder 4. The second shift register 9b receives the column access instruction with autoprecharge RD-APC via an internal signal line 10bAt branch nodes 11a11b, the column access instructions produced by the command decoder 4, which are supplied to the shift registers 9a, 9b, are branched off and are applied via lines 12a, 12b directly to the APC counter 3 in order to start the counting operation. The output sides of the shift registers 9a, 9b output the internal column access instructions WR-$APC_{int}$, RD-$APC_{int}$, delayed in accordance with the set latency, via control lines 13a, 13b to an access logic unit, which is not shown. The autoprecharge counter 3 uses an internal clock signal line 14 to receive the row clock signal CLK-ROW which is output by the clock signal delay circuit 6. Since the counting operation is initiated by the output signals from the command decoder 4 and not by the output signals from the shift registers 9, which are clocked with the internal column clock signal $CLK_{int-COLUMN}$, the inventive DRAM chip 1, as is shown in FIG. 4, does not experience a signal transition between two clock signal domains. The autoprecharge counter 3 delays the column access instructions WR-APC, RD-APC produced by the command decoder 4 respectively in accordance with a programmable count in order to produce an internal autoprecharge instruction APC for the associated memory cell bank 2, the internal autoprecharge instruction APC being output via a line 15 to a first input of an OR circuit 16. The OR circuit 16 has a second input which receives a precharge row access instruction (ROW-pre) via a line 17. The ORing allows either write or read access with autoprecharge or a separate independent precharge operation to be carried out. On the output side, the OR circuit is connected via a control line 18 to a row control logic unit 19 which is clocked by the internal row clock signal $CLK_{int-ROW}$. The row control circuit 19 also receives the activation row access instruction $ROW_{ACT}$ from the command decoder 4 via a line 20. The row control logic unit 19 generates a row selection control signal $ROW_{select}$ and applies it to the memory cell bank 2 via a line 21. The row selection control signal $ROW_{SELECT}$ is set with the activate instruction and is reset with the (auto)precharge instruction.

The APC counter 3 uses a line 22 from a multiplexer 23 to receive a counter start value SW which is read from a programmable start value memory 24 on the basis of the decoded internal column access instruction. In the case of the embodiment shown in FIG. 4, the start value memory 24 stores a counter start value for a write instruction with autoprecharge WR-APC and a start value for a read instruction with autoprecharge RD-APC. Once the multiplexer 23 in the embodiment shown in FIG. 4 receives the WR-APC signal from the command decoder 4 via a control line 25, the relevant counter start value WR-SW is read from the start value memory 24 and is output to the APC counter 3. Conversely, the read start value RD-SW is output to the APC counter 3.

Figure 5:
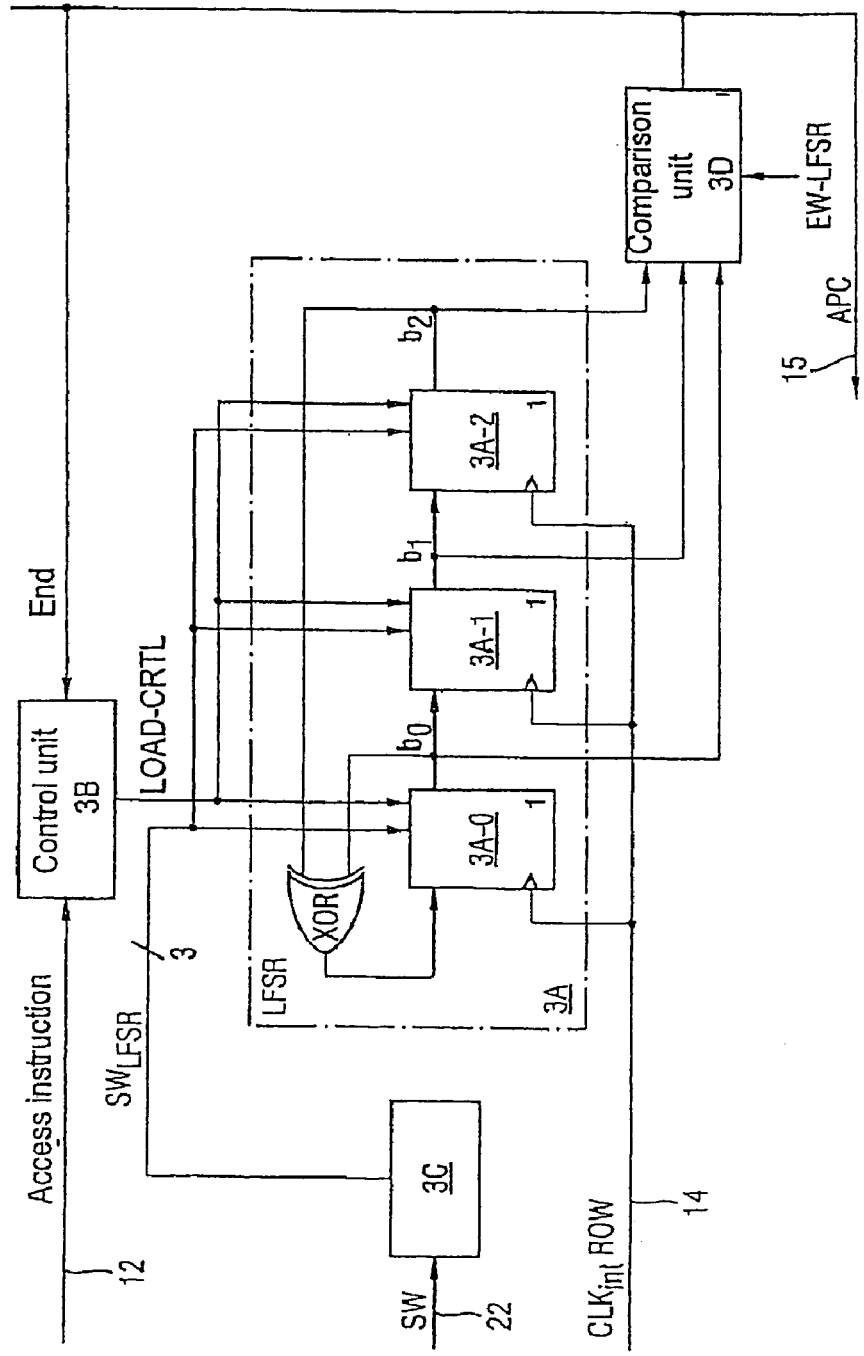
FIG. 5 is a preferred embodiment of the autoprecharge counter used in the inventive DRAM memory.
Figure 6:
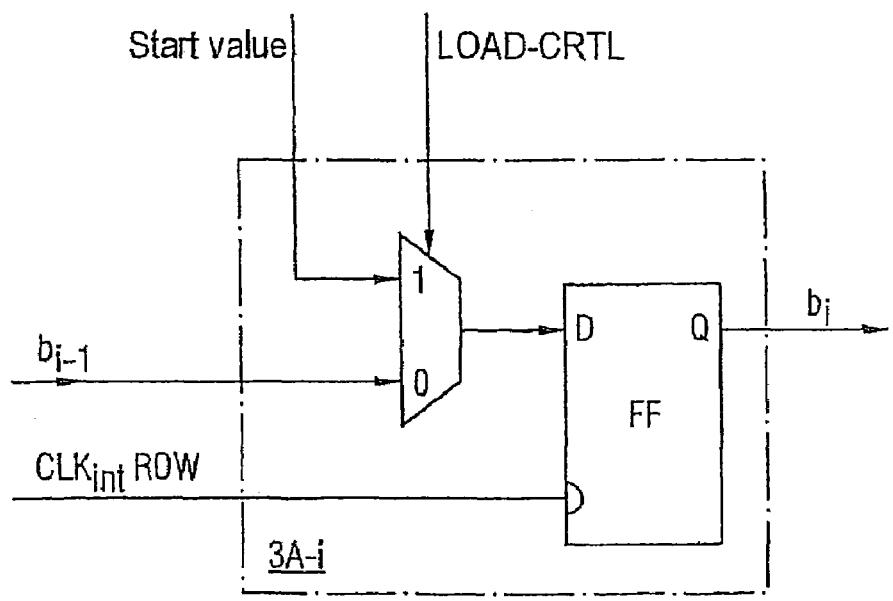
FIG. 6 is a shift element within an LFSR shift register which is used in a preferred embodiment of the inventive autoprecharge counter.

FIG. 5 shows a preferred embodiment of the autoprecharge counter 3 used within the inventive DRAM chip 1. The APC counter 3 contains a linear feedback shift register 3A which is preferably programmable. The linear feedback shift register 3A produces pseudo-random numbers. The LFSR 3A is a sequential shift register with combinational feedback which produces a pseudo-random data sequence of binary values which is repeated periodically. The linear feedback shift register 3A contains a plurality of shift components 3A-0, 3A-1, 3A-2. A shift component is shown in FIG. 6. These shift register components respectively contain a flip-flop, for example a D-type flip-flop, whose data input D receives from a multiplexer either an output data item from the preceding shift register component or a data bit from an LFSR start value, the multiplexer being actuated by a load control signal LOAD-CRTL. The load control instruction for changing over the multiplexers which the shift register components 3A-1 contain is received by the LFSR shift register via a control line from an internal control unit 3B provided in the APC counter 3. An LFSR start value is received by the LFSR shift register 3A from a conversion circuit 3C, provided in the APC counter 3, which converts the binary-coded counter start value which has been read from the start value memory 24 into an LFSR start value for the linear feedback shift register 3A. Upon receiving the column access instruction WR-APC, RD-APC from the command decoder 4 via the line 12, the control unit 3B loads the LFSR start value SW-LSR which has been output by the conversion circuit 3C into the shift register 3A and starts the counting operation. The APC counter 3 also contains a comparison unit 3D which compares the current LFSR count from the shift register 3A with an adjustable LFSR final value EW-LFSR and stops the counting operation when the count in the shift register 3A reaches the LFSR final value. As soon as the count in the LFSR shift register 3A reaches the LFSR final value, the comparison unit 3D of the APC counter 3 outputs an internal autoprecharge instruction APC via the control output line 15 to the OR gate 16 shown in FIG. 4. In addition, the control unit 3B has the end of the counting operation signalled to it.

The combinational feedback using the XOR gate shown in FIG. 5 means that the LFSR shift register 3A produces a psuedo-random sequence of binary values which is repeated periodically. By combining the data outputs of the various shift register components 3A-1 to form a feedback signal, which is applied to the input of the first shift register component 3A-0, the sequence length or the period of the pseudo-random sequence is determined. The maximum sequence length or period is: $P=2^{n}-1$, where n is the number of shift register components 3A-I.

FIG. 5 shows an embodiment of an LFSR shift register 3A with three shift register components 3*a-i*, i.e. the number n of shift register components is 3, which means that the sequence length or period in the example shown is seven.

The bit combination at the output of the LFSR shift register 3A is thus repeated cyclically every 7 clock cycles.

In the example shown in FIG. 5, the data bits from the various shift register components 3A-I are logically combined as follows:

$B_0 := b_0 {}^{XOR} b_2$ $b_1 := b_0$ $b_2 := b_1$

This results in the following sequence:

|       | $b_2$ | $b_1$ | $B_0$ |
|-------|-------|-------|-------|
| $t_0$ | 1     | 1     | 0     |
| $t_1$ | 1     | 0     | 1     |
| $t_2$ | 0     | 1     | 0     |
| $t_3$ | 1     | 0     | 0     |
| $t_4$ | 0     | 0     | 1     |
| $t_5$ | 0     | 1     | 1     |
| $t_6$ | 1     | 1     | 1     |
| $t_7$ | 1     | 1     | 0     |

The conversion circuit 3C in the APC counter 3 converts the binary-coded start values which have been read into LFSR start values. By way of example, if the APC counter 3 shown in FIG. 5 is intended to count up to 5 and the final value chosen is the bit combination $b_2, b_1, b_0=0\ 1\ 1$ then the LFSR start value is the bit combination $b_2, b_1, b_0=1\ 1\ 0$, as can be seen from the table.

The start value SW=1 0 1 binary-coded from the start value memory 24 is converted into the LFSR start value $b_2, b_1, b_0=1\ 1\ 0$. The use of an LFSR shift register 3A has the advantage that the counting speed of the autoprecharge counter 3 is comparable to the counting speed of a conventional shift register, but the space requirement corresponds to that of a normal, conventional binary counter. Although conventional binary counters require little surface area, the speed is indirectly proportional to the counting range required, i.e. the larger the counting ranges become the slower are these conventional binary counters. In the case of the inventive APC counter, the speed is not dependent on the counting range and the space requirement is comparable to that of a binary counter.

FIG. 7 shows signal flow diagrams to explain the way in which an autoprecharge operation works in an inventive DRAM store 1, as is shown in FIG. 4. When the command decoder 4 receives an external memory access instruction, which is a read instruction RD in the example shown, via the external command bus 5 the command decoder 4 outputs an internal column access instruction with autoprecharge RD-APC to the APC counter 3 via the line 12. Upon the next rising edge of the internal column clock signal $CLK_{int-Row}$, the APC counter 3 is activated and starts the counting operation. In the example shown, the read counter start value which has been set is three. Upon the third rising edge of the column clock signal, the comparison unit 3D within the APC counter 3 recognises that the final value has been reached and generates an internal autoprecharge instruction APC, which is output to the OR gate 16 by the APC counter 3 via a line 15, as is shown in FIG. 4.

The use of the inventive APC counter 3 minimizes the memory access times for autoprecharge without the APC counter 3 making counting errors. In addition, the use of an LFSR shift register 3A within the inventive APC counter 3 allows relatively high counting ranges to be set without there being a decrease in the speed of the counter. The inventive APC counter 3 is flexibly programmable and is suitable particularly for DRAM memory chips which operate at very high clock frequencies. The inventive APC counter 3 requires relatively little space for integration in a chip and consumes correspondingly little power.

Although modifications and changes may be suggested by those skilled in the art, it is the intention of the inventor to embody within the patent warranted hereon all changes and modifications as reasonably and properly come within the scope of his contribution to the art.

What is claimed is:

1. A DRAM memory, comprising:
    at least one memory cell bank comprising memory cells which can be activated by means of internal row and column access instructions; each memory cell bank comprising an associated autoprecharge (APC) counter for delaying a column access instruction with autoprecharge;
    a command decoder generating, dependent on an external memory access instruction, at least one column access instruction within a first decoding time and at least one row access instruction within a second decoding time; and
    a clock signal delay circuit for delaying an external clock signal with the first decoding time in order to generate an internal column clock signal and for delaying the external clock signal with the second decoding time in order to generate an internal row clock signal; wherein each of the column access instructions generated by the command decoder are respectively delayed by an associated shift register being clocked by the internal column clock signal in order to generate the internal column access instructions, and wherein the APC counter is clocked by the internal row clock signal and delays each of the column access instructions generated by the command decoder in accordance with an associated programmable count in order to produce an internal autoprecharge instruction for the associated memory cell bank.

2. The DRAM memory of claim 1, wherein the APC counter comprises a linear feedback shift register (LFSR).

3. The DRAM memory of claim 2, wherein the linear feedback shift register is programmable.

4. The DRAM memory of claim 3, wherein the APC counter receives a programmable counter start value to be read from a start value memory utilizing a multiplexer.

5. The DRAM memory of claim 4, wherein the start value memory stores an associated counter start value for each column access instruction.

6. The DRAM memory of claim 5, wherein the start value memory is programmable.

7. The DRAM memory of claim 6, wherein the stored counter start values are in binary-coded form.

8. The DRAM memory of claim 7, wherein the APC counter comprises a conversion circuit which converts the binary-coded counter start value which has been read from the start value memory into an LFSR start value for the linear feedback shift register.

9. The DRAM memory of claim 8, wherein the APC counter comprises a control unit which, upon receiving the column access instruction, loads the LFSR start value into the linear feedback shift register and starts the counting operation.

10. The DRAM memory of claim 9, wherein the APC counter comprises a comparison unit which stops the counting operation and outputs the internal autoprecharge instruction when the linear feedback shift register reaches an adjustable LFSR final value.

11. The DRAM memory of claim 1, wherein the shift registers delay the column access instructions in accordance with a latency.

12. The DRAM memory of claim 1, wherein the command decoder produces a write column access instruction, a read column access instruction, an activation row access instruction, and a precharge row access instruction.

13. The DRAM memory of claim 1, wherein the first decoding time is shorter than the second decoding time.

* * * * *